United States Patent
Mendenhall (10) Patent No.: US 8,253,491 B2
(45) Date of Patent: *Aug. 28, 2012

(54) METHOD AND APPARATUS FOR POWER CONVERTER FOR CLASS D AUDIO POWER AMPLIFIERS

(75) Inventor: Eric Mendenhall, Dove Canyon, CA (US)

(73) Assignee: RGB Systems, Inc., Anaheim, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/949,731

(22) Filed: Nov. 18, 2010

(65) Prior Publication Data

US 2011/0182087 A1    Jul. 28, 2011

Related U.S. Application Data

(63) Continuation of application No. 12/483,736, filed on Jun. 12, 2009, now Pat. No. 7,839,215.

(60) Provisional application No. 61/061,986, filed on Jun. 16, 2008.

(51) Int. Cl.
*H03F 3/217* (2006.01)

(52) U.S. Cl. .............. 330/251; 330/297; 330/207 A
(58) Field of Classification Search .............. 330/10, 330/207 A, 251, 296–297; 363/17, 97–98, 363/131–134

See application file for complete search history.

(56) References Cited

U.S. PATENT DOCUMENTS

2005/0017804 A1* 1/2005 Bier .......................... 330/251

FOREIGN PATENT DOCUMENTS

WO    WO 2007/096761 A1    8/2007

* cited by examiner

*Primary Examiner* — Hieu Nguyen
(74) *Attorney, Agent, or Firm* — The Hecker Law Group, PLC (57) ABSTRACT

A method and apparatus for power conversion in a class D amplifier is provided. The power conversion is achieved using synchronous rectifiers in a regulated half bridge power supply, taking the sum of the positive and negative rails as feedback, in order facilitate energy transfer between positive and negative output rails. This minimizes the effects of off side charging and rail sag, as well as achieving good line regulation, while allowing use of very small, low value output capacitors.

3 Claims, 10 Drawing Sheets

FIG. 1

(Prior Art)

METHOD AND APPARATUS FOR POWER CONVERTER FOR CLASS D AUDIO POWER AMPLIFIERS

CROSS-REFERENCE TO RELATED APPLICATIONS

This patent application is a continuation of U.S. patent application Ser. No. 12/483,736 filed Jun. 12, 2009, which issued as U.S. Pat. No. 7,839,215 on Nov. 23, 2010 and which claims the benefit of the filing date of U.S. Provisional Patent Application No. 61/061,986 filed Jun. 16, 2008.

BACKGROUND OF THE INVENTION (1) Field of the Invention

The present invention relates generally to electronics for converting power and amplifying signals and more particularly to a method and apparatus for providing power to an amplifier.

(2) Description of the Related Art

Figure 1:
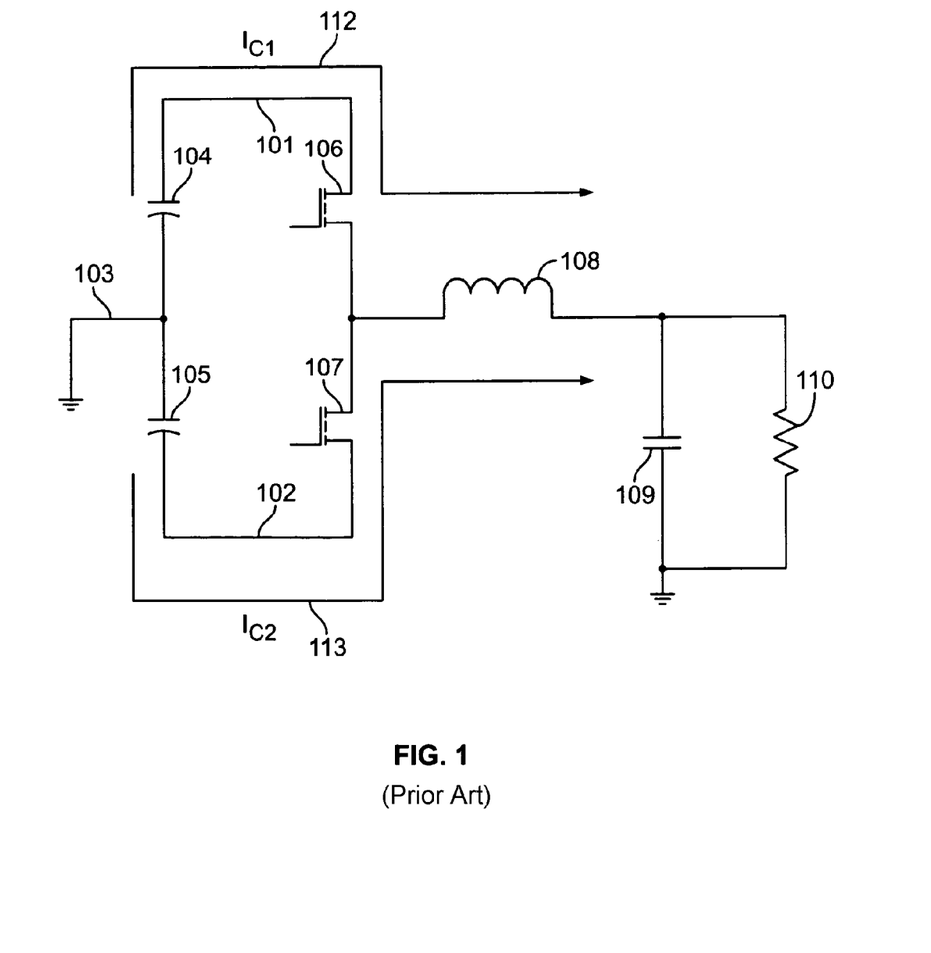
FIG. 1 is a schematic diagram illustrating an example of a half bridge class D amplifier.

FIG. 1 is a schematic diagram illustrating an example of a half bridge class D amplifier. The half bridge class D amplifier comprises a positive supply voltage rail 101, a negative supply voltage rail 102, a ground 103, a positive supply voltage filter capacitor 104, a negative supply voltage filter capacitor 105, a high side driver 106, a low side driver 107, a low pass output filter inductor 108, a low pass output filter capacitor 109, and a load 110. A class D audio power amplifier in half bridge configuration presents several problems for the power supply. One example of such problems is off side charging.

Off-Side Charging

A half bridge configured class D amplifier will cause "off side charging," or "rail pumping," in which energy is transferred from the loaded converter output to the unloaded converter output. The loaded converter output is the portion of the power supply that supplies a first supply voltage to a first supply voltage rail from which the half bridge class D amplifier is currently drawing power. The unloaded converter output is the portion of the power supply that supplies a second supply voltage to a second supply voltage rail from which the half bridge class D amplifier is not intended to be currently drawing power. For example, when a high side driver 106 is active, power is provided from a power supply to a positive supply voltage rail 101 for the half bridge class D amplifier that comprises high side driver 106. During such time, a first portion of the power supply circuit that provides the positive supply voltage on the positive supply voltage rail 101 would be the loaded converter output, and a second portion of the power supply circuit that provides the negative supply voltage on the negative supply voltage rail 102 would be the unloaded converter output. As another example, when a low side driver 107 is active, power is provided from a power supply to a negative supply voltage rail 102 for the half bridge class D amplifier that comprises low side driver 107. During such time, the second portion of the power supply circuit that provides the negative supply voltage on the negative supply voltage rail 102 would be the loaded converter output, and the first portion of the power supply circuit that provides the positive supply voltage on the positive supply voltage rail 101 would be the unloaded converter output.

The off side charging, or rail pumping, condition occurs in half bridge class D amplifiers, as the load of a half bridge class D amplifier is coupled between the loaded converter output and ground and the filter capacitor of the unloaded converter output is coupled between its corresponding unloaded supply voltage rail and ground. Off side charging will cause the magnitude of the unloaded supply voltage of the unloaded rail to increase, which can easily make it exceed the voltage ratings of the class D amplifier devices, as well as causing distortion by introducing nonlinearity in the forward transfer function.

To minimize the impact of off side charging, large value capacitors are often used on the positive and negative power supply rails. However, the capacitance required is not proportional to the power output of the amplifier, but rather inversely proportional to the load impedance. This means that low power amplifiers driving low impedance loads require a large amount of capacitance disproportionate to their lower power output.

Figure 2:
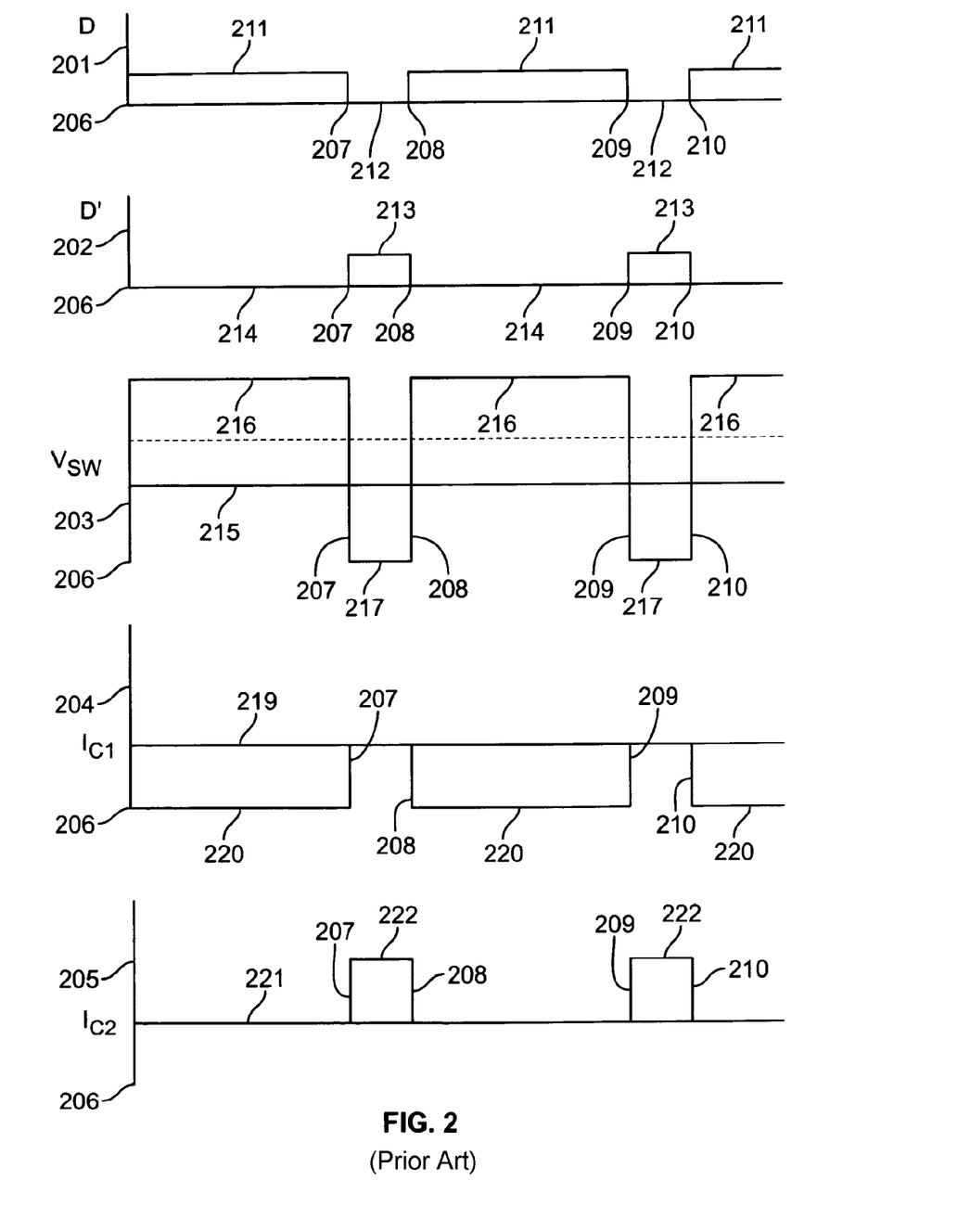
FIG. 2 is a timing diagram showing voltages illustrating an example of off side charging of power supply voltage rails resulting from operation of a half bridge class D amplifier.

FIG. 2 is a waveform diagram illustrating an example of off side charging of power supply voltage rails resulting from operation of a half bridge class D amplifier. The duty cycle D is set at 75%, making D' (i.e., not D, the opposite of D) 25%. This will theoretically result in an output voltage of Vrail/2 and an output current of Vrail/2R. This makes the off-side charging current equal to D'*Vrail/2R. For the purpose of this example, the inductor 108 can be considered to have a value large enough to ignore the ripple and treat it as a constant current source.

Waveform 201 depicts an example of a waveform of the voltage of an enable signal D to enable a high side driver 106 of an example of a half bridge class D amplifier. Waveform 201 goes high, to an enabling voltage 211, at time 206. Waveform 201 remains high, at enabling voltage 211, until time 207, when it goes low, to a disabling voltage 212. Waveform 201 remains at disabling voltage 212 until it again goes high, to the enabling voltage 211, at time 208. Waveform 201 remains high, at enabling voltage 211, until time 209, when it again goes low, to disabling voltage 212. Waveform 201 remains low, at disabling voltage 212, until time 210, when it again goes high, to enabling voltage 211. As this example depicts a duty cycle of 75%, waveform 201 is high, at enabling voltage 211, 75% of the time and low, at disabling voltage 212, 25% of the time.

Waveform 202 depicts an example of a waveform of the voltage of an enable signal D' to enable low side driver 107 of an example of a half bridge class D amplifier. Waveform 202 goes low, to a disabling voltage 214, at time 206. Waveform 202 remains low, at disabling voltage 214, until time 207, when it goes high, to an enabling voltage 213. Waveform 202 remains at enabling voltage 213 until it again goes low, to disabling voltage 214, at time 208. Waveform 202 remains low, at disabling voltage 214, until time 209, when it again goes high, to enabling voltage 213. Waveform 202 remains high, at enabling voltage 213, until time 210, when it again goes low, to disabling voltage 214. As this example depicts a duty cycle of 75% for D, waveform 202, for D', is high, at enabling voltage 213, 25% of the time and low, at disabling voltage 214, 75% of the time.

Waveform 203 depicts an example of a waveform of a voltage at a junction 111 of a high side driver 106 and a low side driver 107. Waveform 203 goes high, to a positive supply voltage 216, at time 206. Waveform 203 remains high, at positive supply voltage 216, until time 207, when it goes low, to a negative supply voltage 217. Waveform 203 remains at negative supply voltage 217 until it again goes high, to the positive supply voltage 216, at time 208. Waveform 203 remains high, at positive supply voltage 216, until time 209, when it again goes low, to negative supply voltage 217. Waveform 203 remains low, at negative supply voltage 217, until time 210, when it again goes high, to positive supply voltage 216. As this example depicts a duty cycle of 75%, waveform 203 is high, at positive supply voltage 216, 75% of the time and low, at negative supply voltage 217, 25% of the time. Inductor 108 and capacitor 109 act as a low pass filter to filter out the high frequency switching between the positive supply voltage 216 and the negative supply voltage 217, resulting in a steady voltage 218 that lies 75% of the way from the negative supply voltage 217 to the positive supply voltage 216 (i.e., at approximately half of the positive supply voltage in the example where ground 103 has a ground voltage that is centered between positive supply voltage 216 and the negative supply voltage 217).

Waveform 204 depicts an example of a waveform of a charging current 112, which flows while the high side driver 106 is active. Waveform 204 goes to a negative current level 220 at time 206. Waveform 204 remains at the negative current level 220 until time 207, when it goes to a zero current level 219. Waveform 204 remains at zero current level 219 until it again goes to negative current level 220 at time 208. Waveform 204 remains at negative current level 220 until time 209, when it again goes to zero current level 219. Waveform 204 remains at zero current level 219 until time 210, when it again goes to negative current level 220. As this example depicts a duty cycle of 75%, waveform 204 is at negative current level 220 75% of the time and at zero current level 219 25% of the time.

Waveform 205 depicts an example of a waveform of a charging current 113, which flows while the low side driver 107 is active. Waveform 205 remains at a zero current level 221 from time 206 to time 207. Waveform 205 goes to a positive current level 222 at time 207. Waveform 205 remains at positive current level 222 until it again goes to zero current level 221 at time 208. Waveform 205 remains at zero current level 221 until time 209, when it again goes to positive current level 222. Waveform 205 remains at positive current level 222 until time 210, when it again goes to zero current level 221. As this example depicts a duty cycle of 75%, waveform 205 is at zero current level 221 75% of the time and at positive current level 222 25% of the time.

The worst case for off-side charging can be derived by setting the derivative to zero and solving for D. For example, where Vout=2*Vrail*D=Vrail, Iout=Vout/R, and Ichg=(1−D)*Iout (i.e., the off side charging current), Ichg=(1−D)*Iout=(1−D) Vout/R=(−2*Vrail*D^2+3*Vrail*D−Vrail)/R. The derivative is set to zero as follows: dIchg/dD=(−2*Vrail*(2*D)+3*Vrail)/R=0. Consistent with the example of setting the duty cycle D at 75%, the equation is solved for D=¾, as the worst case off side charging occurs with D=¾ and Vout=Vrail/2. Accordingly, solving Ichg for D=¾ is performed as follows: Ichg=(−2*Vrail*(¾)^2+3*Vrail*(¾)−Vrail)/R=Vrail/(8*R). For typical audio applications, the worst case for Ichg will be a squarewave at 20 Hz, where Vout=Vrail/2. Accordingly, Ichg=C*dV/dt. Therefore, Vrail/(8*R)=C*(Vrail/8)/50 mS, setting the desired change in V at Vrail/8 for a 12.5% change. Thus, C=1/(20*R). Consequently, for an eight ohm load, C=6250 uF. As noted above, the value of C is a function of the output impedance, not the output power, so the above calculation is valid for a given percentage of fluctuation of Vrail and a given output impedance, regardless of the value of Vrail and the output power. Actual capacitance may be less if only sinewaves are used, but the result remains the same that C is inversely proportional to R, not proportional to power. The above calculation shows that to keep charging to ⅛ (i.e., 12.5%) of the initial rail voltage during a 20 Hz squarewave of Vrail/2 peak, the capacitance needs to be 1/(20*R) farads, or 6250 uF for each rail at eight ohms. That would require 12,500 uF per rail at 4 ohms, or 25,000 uF per rail at 2 ohms. A total capacitance of 50,000 uF is very large and unrealistic for a low power design, as large value capacitors are typically expensive and of large physical size, which both run counter to the low cost and small size generally preferred in modern electronics.

Figure 3:
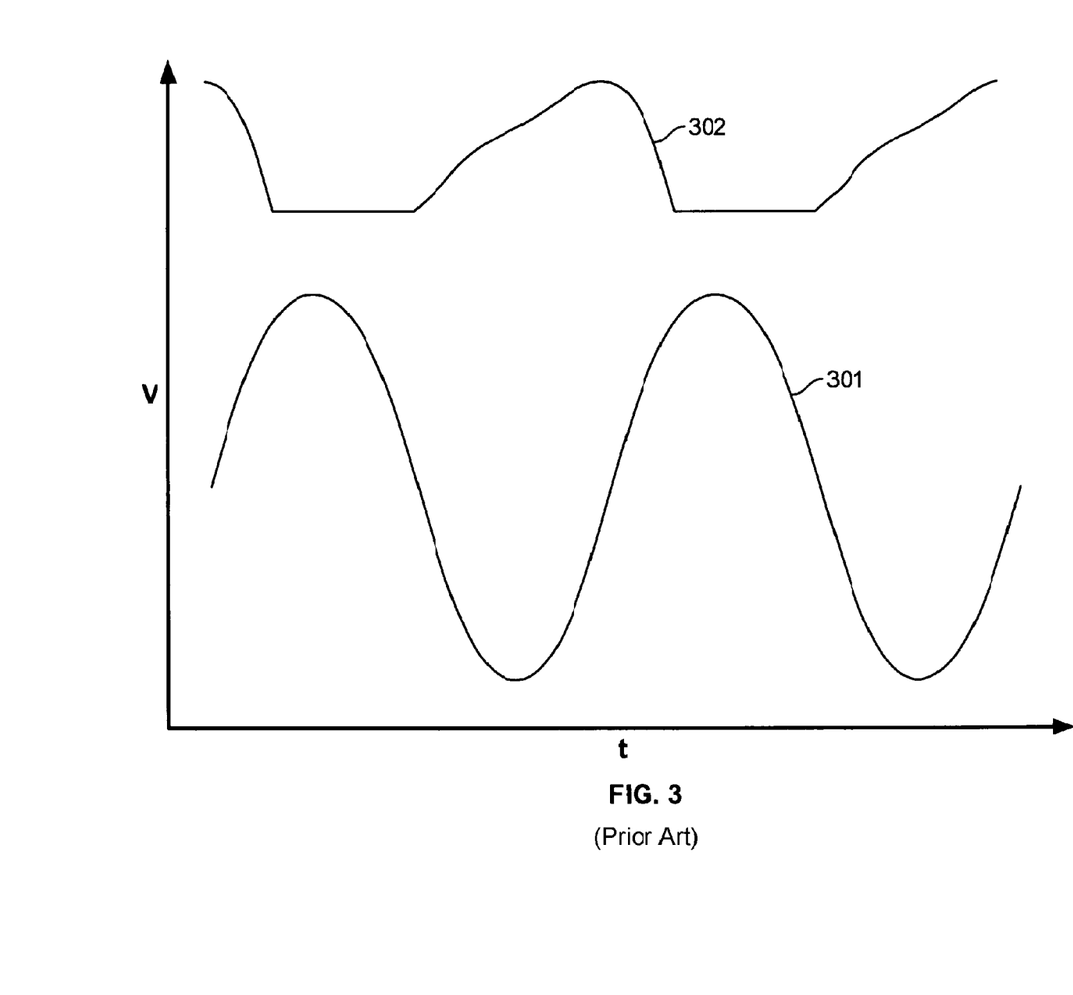
FIG. 3 is a timing diagram showing voltages illustrating an example of power supply voltage rail fluctuation resulting from off side charging.

FIG. 3 is a waveform diagram illustrating an example of power supply voltage rail fluctuation resulting from off side charging. The waveform diagram is an example of what might be obtained using an oscilloscope to view waveforms of an actual circuit illustrating the problem. Waveform 301 depicts an AC waveform at the output of a transformer secondary winding, before rectification. Waveform 302 depicts a DC power supply voltage rail with substantial ripple arising from off side charging. In this case, a 50% voltage rise is obtained with 1,000 uF per rail at 4 ohms with a 20 Hz sine wave (a square wave would be somewhat worse). To achieve 3% voltage rise would take 15,000 uF each rail.

Regulation

The difficulty of providing power to a half bridge class D amplifier is further complicated by the use of a regulated power supply, which are typically regulated based only the positive supply voltage rail. In that case, any increase in the magnitude of the negative supply voltage rail will not enter into the feedback loop. Therefore, no correction for such increase will occur. If the positive rail is loaded and the negative rail is off side charged, then the amplifier is subjected to a possible overvoltage and nonlinearity. If the negative rail is loaded, it can sag all the way to zero without the feedback loop taking corrective action. Such lack of corrective action causes the amplifier output voltage to fall. The falling output voltage of the amplifier causes lower power output and distortion of the signal being amplified, which adversely affects the power rating and the sound quality of the amplifier's output.

If, as an alternative, the sum of the positive and negative output supplies is used to feed back into the regulation circuit, then any increase in the "off side charging" rail will allow a corresponding decrease in the loaded rail, causing the amplifier output voltage to fall. The situation occurs if the loaded rail is positive or negative. Again, the falling output voltage causes lower power output and distortion of the signal being amplified.

Typical prior art involves large capacitors and unregulated supplies to mitigate these effects for a half bridge class D amplifier, but rail sag (i.e., ineffective load regulation) is still present, reducing output power, and line regulation is not achieved. Moreover, the large capacitors in the power supply circuits add to the expense and physical size of amplifiers that utilize them.

Other prior art makes use of the full bridge class D amplifier to avoid these problems. However, full bridge class D amplifiers have several drawbacks such a large DC offset present on the output terminals, an inability to operate two channels into one load in bridge mono mode, and they require twice as many output driver stages and output filters as half bridge class D amplifiers, which adds to the expense and physical size of full bridge class D amplifiers.

Thus, a solution is needed that avoids the disadvantages of prior art techniques.

BRIEF SUMMARY OF THE INVENTION

A method and apparatus for power conversion in a class D amplifier is provided. The power conversion is achieved using synchronous rectifiers in a regulated half bridge power supply, taking the sum of the positive and negative rails as feedback, in order facilitate energy transfer between positive and negative output rails. This minimizes the effects of off side charging and rail sag, as well as achieving good line regulation, while allowing use of very small, low value output capacitors.

BRIEF DESCRIPTION OF THE DRAWINGS

The present invention may be better understood, and its features made apparent to those skilled in the art by referencing the accompanying drawings.

The use of the same reference symbols in different drawings indicates similar or identical items.

DETAILED DESCRIPTION OF THE INVENTION

A method and apparatus for power conversion in a class D amplifier is provided. The power conversion is achieved using synchronous rectifiers in a regulated half bridge power supply, taking the sum of the positive and negative rails as feedback, in order facilitate energy transfer between positive and negative output rails. This minimizes the effects of off side charging and rail sag, as well as achieving good line regulation, while allowing use of very small, low value output capacitors.

Figure 4:
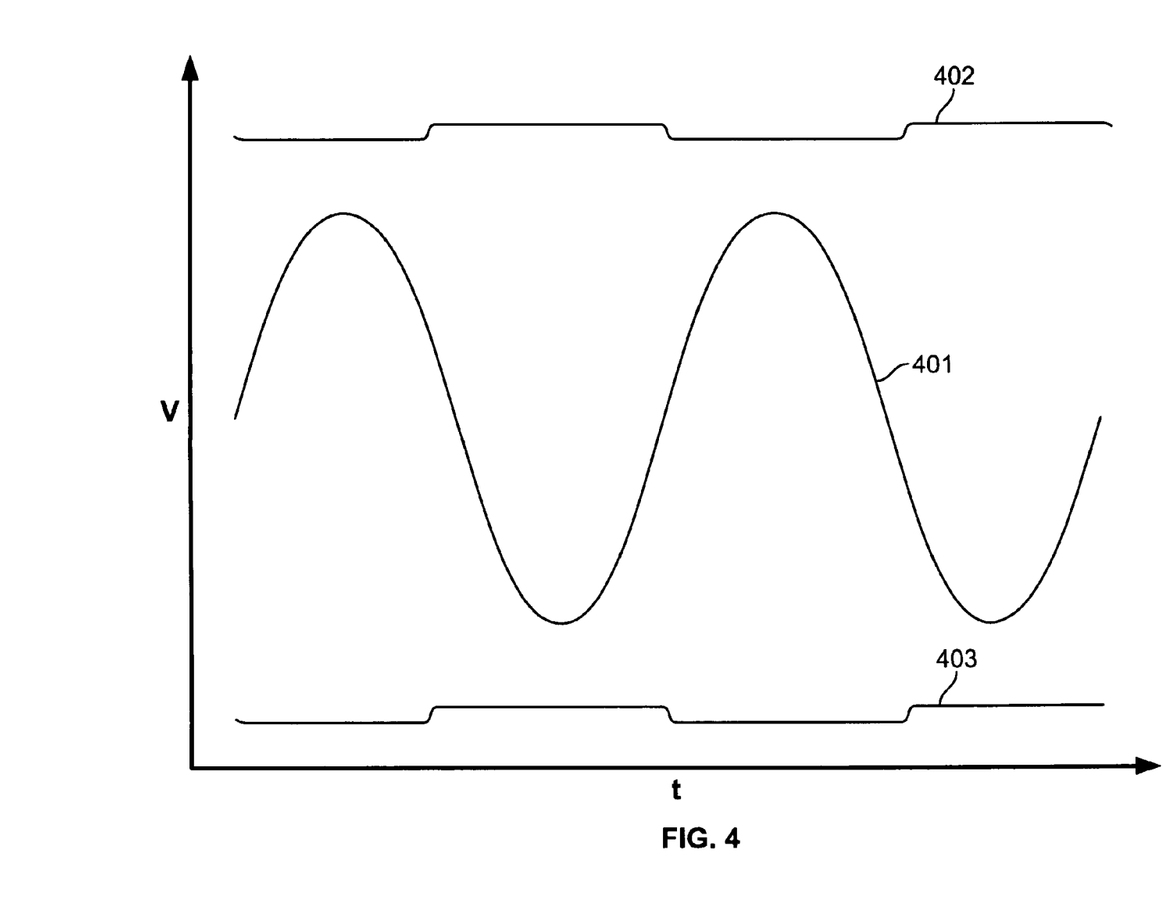
FIG. 4 is a timing diagram showing voltages illustrating an example of power supply voltage rail regulation in accordance with at least one embodiment.

FIG. 4 is a waveform diagram illustrating an example of power supply voltage rail regulation in accordance with at least one embodiment. Waveform 401 depicts an AC waveform at the output of a transformer secondary winding, before rectification. Waveform 402 depicts a positive power supply voltage rail substantially free of ripple arising from off side charging. Waveform 403 depicts a negative power supply voltage rail substantially free of ripple arising from off side charging. As can be seen from the diagram, such an embodiment can achieve, for example, a 3% rise in rail voltage with only 150 uF per rail with a 20 Hz sinewave into 4 ohms. This amount of voltage rise would require about two orders of magnitude more capacitance if prior art techniques were used.

While synchronous rectifiers were previously used in prior art power supply designs to reduce the losses in the passive output rectifiers, such designs failed to make use of the bidirectional conductivity of devices such as MOSFETs. However, in accordance with at least one embodiment, synchronous rectifiers having bidirectional conductivity are used to transfer energy between outputs, that is, from the unloaded rail to the loaded rail. Such a transfer of energy effectively counteracts the off side charging that occurs in power supplies for prior art half bridge class D power amplifiers.

Synchronous rectifiers are also used in prior art power supply designs in order to transfer energy from the load back to the source, but topologies where this had been done usually incurred large idle losses due to circulating currents. However, in accordance with at least one embodiment, efficient transfer of energy via synchronous rectifiers provides effective compensation for off side charging phenomena in class D power amplifier systems.

The use of the synchronous rectifiers allows the feedback to be taken from the sum of the positive and negative rails, since float and sag is minimized, and the class D amplifier is protected from overvoltage.

Figure 5:
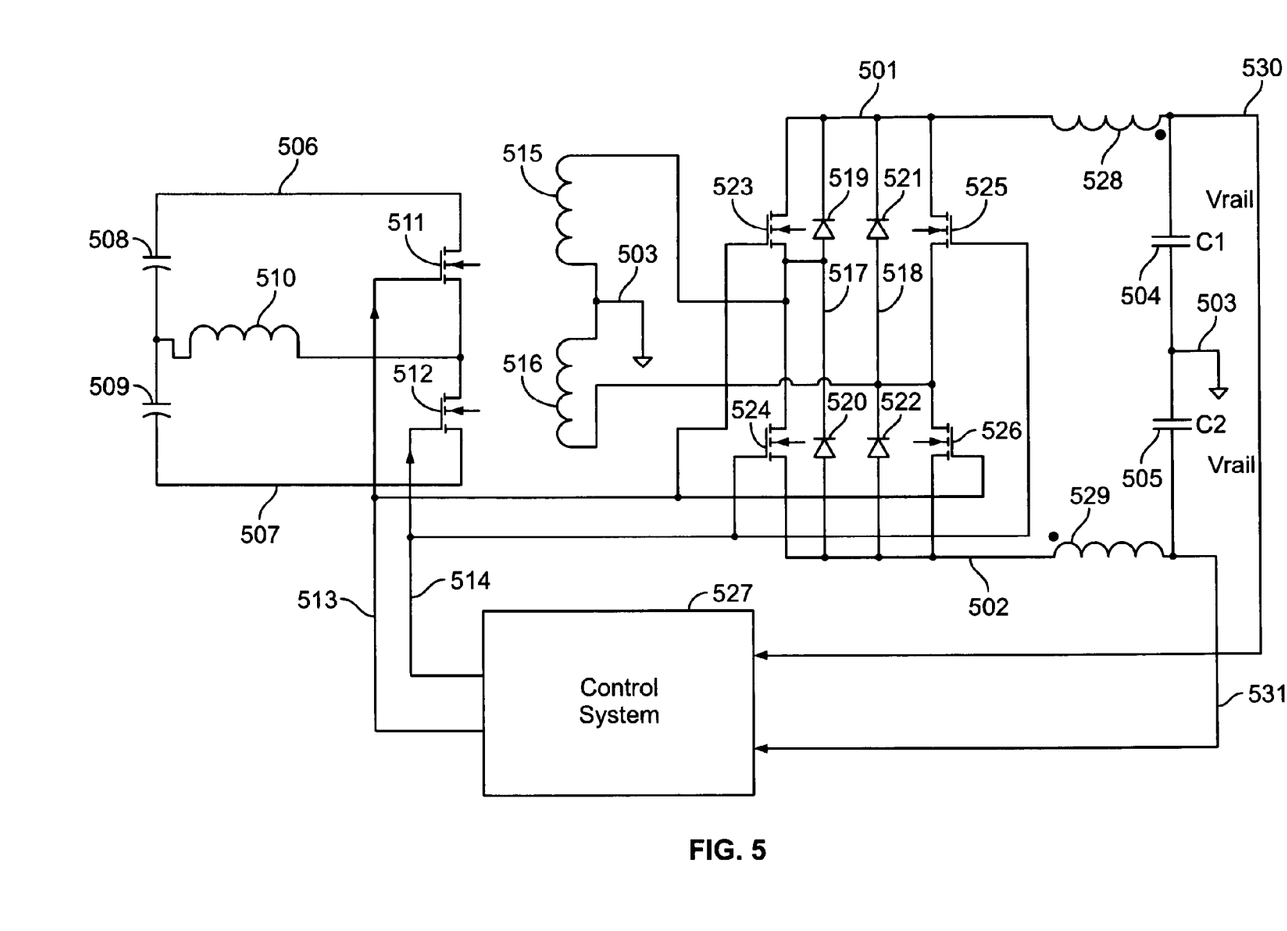
FIG. 5 is a schematic diagram illustrating an example of an apparatus for power conversion for a class D amplifier in accordance with at least one embodiment.

FIG. 5 is a schematic diagram illustrating an example of an apparatus for power conversion for a class D amplifier in accordance with at least one embodiment. Primary supplies voltages rails, for example, first primary supply voltage rail 506 and second primary supply voltage rail 507, are provided. For example, first primary supply voltage rail 506 may be a positive primary supply voltage rail, and second primary supply voltage rail 507 may be a negative primary supply voltage rail. A first primary supply capacitor 508 is connected between first primary supply voltage rail 506 and a first terminal of transformer primary winding 510. A second primary supply capacitor 509 is connected between second primary supply voltage rail 507 and the first terminal of transformer primary winding 510. A first primary switch 511 is connected between first primary supply voltage rail 506 and a second terminal of transformer primary winding 510. A second primary switch 512 is connected between second primary supply voltage rail 507 and a second terminal of transformer primary winding 510.

A first terminal of a transformer first secondary winding 515 is connected to an anode of a first diode 519 and a second terminal of a first switch 523, as well as to a cathode of a second diode 520 and a first terminal of a second switch 524. A second terminal of the transformer first secondary winding 515 is connected to ground 503. A first terminal of a transformer second secondary winding 516 is connected to ground 503. A second terminal of a transformer second secondary winding 516 is connected to an anode of a third diode 521 and a second terminal of a third switch 525, as well as to a cathode of a fourth diode 522 and a first terminal of a fourth switch 526. A positive supply voltage rail 501 is connected to a first terminal of the first switch 523, a cathode of the first diode 519, a cathode of the third diode 521, and the first terminal of the third switch 525. A negative supply voltage rail 502 is connected to a second terminal of the second switch 524, an anode of the second diode 520, an anode of the fourth diode 522, and a second terminal of the fourth switch 526.

A first coupled inductor winding 528 is coupled in series with the positive supply voltage rail 501, and a second coupled inductor winding 529 is coupled in series with the negative supply voltage rail 302. The first coupled inductor winding 528 is inductively coupled to the second coupled inductor winding 529 such that the first coupled inductor winding 528 and the second coupled inductor winding 529 are coupled in opposite directions, as indicated by the dots in the diagram. A positive supply filter capacitor 504 is coupled between the positive supply voltage rail 501 and ground 503. A negative supply filter capacitor 505 is coupled between the negative supply voltage rail 502 and ground 503. The positive supply voltage rail 530 and the negative supply voltage rail 531 are coupled to control system 527. Control system 527 monitors the positive supply voltage rail 530 and the negative supply voltage rail 531 and provides a first signal 513 to control first primary switch 511, first switch 523, and fourth switch 526, as well as a second signal 514 to control second primary switch 512, second switch 524, and third switch 525.

Figure 6:
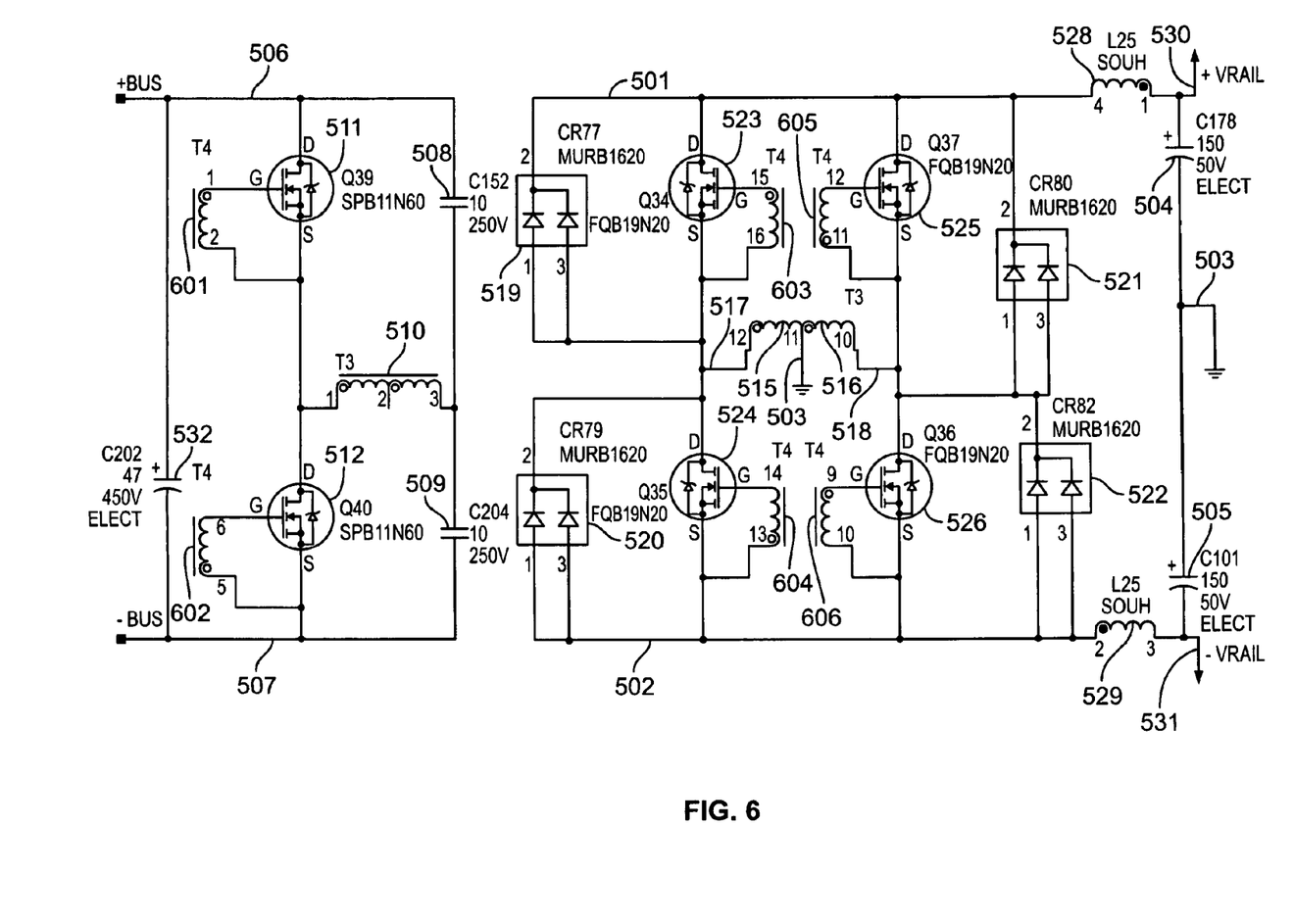
FIG. 6 is a schematic diagram illustrating an example of a power supply for power conversion for a class D amplifier in accordance with at least one embodiment.

FIG. 6 is a schematic diagram illustrating an example of a power supply for power conversion for a class D amplifier in accordance with at least one embodiment. Primary supplies voltages rails, for example, first primary supply voltage rail 506 and second primary supply voltage rail 507, are provided. A capacitor 532 is coupled between first primary supply voltage rail 506 and second primary supply voltage rail 507. For example, first primary supply voltage rail 506 may be a positive primary supply voltage rail, and second primary supply voltage rail 507 may be a negative primary supply voltage rail. A first primary supply capacitor 508 is connected between first primary supply voltage rail 506 and a first terminal of transformer primary winding 510. A second primary supply capacitor 509 is connected between second primary supply voltage rail 507 and the first terminal of transformer primary winding 510. A first primary switch 511 is connected between first primary supply voltage rail 506 and a second terminal of transformer primary winding 510. A second primary switch 512 is connected between second primary supply voltage rail 507 and a second terminal of transformer primary winding 510. A first primary switch control terminal is coupled to a first terminal of a first primary switch control transformer winding 601. A second terminal of the first primary switch control transformer winding 601 is coupled to the second terminal of the transformer primary winding 510. A second primary switch control terminal is coupled to a second terminal of a second primary switch control transformer winding 602. A first terminal of the second primary switch control transformer winding 602 is coupled to second primary supply voltage rail 507. The first primary switch control transformer winding 601 and the second primary switch control transformer winding 602 are inductively coupled to a first switch control transformer winding 603, a second switch control transformer winding 604, a third switch control transformer winding 605, a fourth switch control transformer winding 606, and a pulse width modulator output transformer winding 701.

A first terminal of a transformer first secondary winding 515 is connected to an anode of a first diode 519 and a second terminal of a first switch 523, as well as to a cathode of a second diode 520 and a first terminal of a second switch 524. A second terminal of the transformer first secondary winding 515 is connected to ground 503. A first terminal of a transformer second secondary winding 516 is connected to ground 503. A second terminal of a transformer second secondary winding 516 is connected to an anode of a third diode 521 and a second terminal of a third switch 525, as well as to a cathode of a fourth diode 522 and a first terminal of a fourth switch 526. A positive supply voltage rail 501 is connected to a first terminal of the first switch 523, a cathode of the first diode 519, a cathode of the third diode 521, and the first terminal of the third switch 525. A negative supply voltage rail 502 is connected to a second terminal of the second switch 524, an anode of the second diode 520, an anode of the fourth diode 522, and a second terminal of the fourth switch 526.

A first coupled inductor winding 528 is coupled in series with the positive supply voltage rail 501, and a second coupled inductor winding 529 is coupled in series with the negative supply voltage rail 302. The first coupled inductor winding 528 is inductively coupled to the second coupled inductor winding 529 such that the first coupled inductor winding 528 and the second coupled inductor winding 529 are coupled in opposite directions, as indicated by the dots in the diagram. A positive supply filter capacitor 504 is coupled between the positive supply voltage rail 530 and ground 503. A negative supply filter capacitor 505 is coupled between the negative supply voltage rail 531 and ground 503. The positive supply voltage rail 530 and the negative supply voltage rail 531 are coupled to control system 527. Control system 527 monitors the positive supply voltage rail 530 and the negative supply voltage rail 531 and provides a first signal 513 to control first primary switch 511, first switch 523, and fourth switch 526, as well as a second signal 514 to control second primary switch 512, second switch 524, and third switch 525.

Figure 7:
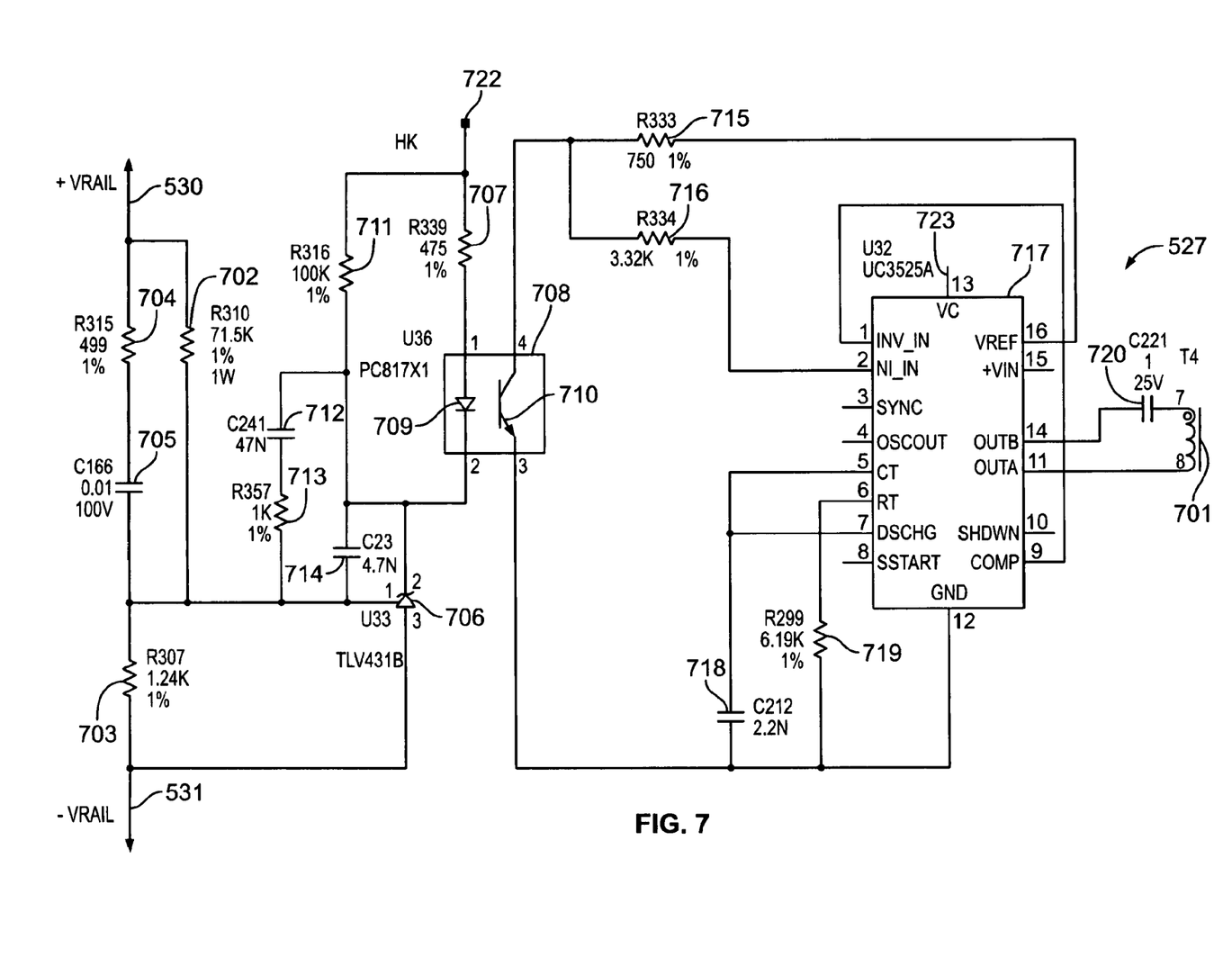
FIG. 7 is a schematic diagram illustrating an example of a power supply control circuit for power conversion for a class D amplifier in accordance with at least one embodiment.

In accordance with at least one embodiment, the first signal 513 and the second signal 514 may be implemented as an alternating current (AC) signal applied to pulse width modulator output transformer winding 701. The pulse width modulator output transformer winding 701 is inductively coupled to the first primary switch control transformer winding 601, the second primary switch control transformer winding 602, a first switch control transformer winding 603, a second switch control transformer winding 604, a third switch control transformer winding 605, and a fourth switch control transformer winding 606.

A first terminal of the first switch control transformer winding 603 is coupled to a first switch control terminal of first switch 523. A second terminal of the first switch control transformer winding 603 is coupled to the first terminal of the transformer first secondary winding 515 at node 517. A first terminal of the second switch control transformer winding 604 is coupled to negative supply voltage rail 502. A second terminal of the second switch control transformer winding 604 is coupled to a second switch control terminal of the second switch 524. A first terminal of a third switch control transformer winding 605 is coupled to a second terminal of the transformer second secondary winding 516 at node 518. A second terminal of the third switch control transformer winding 605 is coupled to a third switch control terminal of the third switch 525. A first terminal of the fourth switch control transformer winding 606 is coupled to a fourth switch control terminal of a fourth switch 526. A second terminal of the fourth switch control transformer winding 606 is coupled to negative supply voltage rail 502.

FIG. 7 is a schematic diagram illustrating an example of a power supply control circuit for power conversion for a class D amplifier in accordance with at least one embodiment. A first terminal of resistor 704 and a first terminal of resistor 702 are coupled to positive supply voltage rail 530. A second terminal of resistor 704 is coupled to a first terminal of capacitor 705. A second terminal of capacitor 705, a second terminal of resistor 702, and a first terminal of resistor 703 are coupled to a regulator control input of regulator 706. A second terminal of resistor 703 and a negative terminal of regulator 706 are coupled to negative supply voltage rail 531. A first terminal of resistor 707 and a first terminal of resistor 711 are coupled to housekeeping voltage supply rail 722. A second terminal of resistor 711 is coupled to a first terminal of capacitor 712, a first terminal of capacitor 714, a positive terminal of regulator 706, and a cathode of a light emitting diode (LED) 709 of optoisolator 708. A second terminal of resistor 707 is coupled to an anode of LED 709 of optoisolator 708. A second terminal of capacitor 712 is coupled to a first terminal of resistor 713. A second terminal of resistor 713 and a second terminal of capacitor 714 are coupled to the regulator control input of regulator 706.

A collector of phototransistor 710 of optoisolator 708 is coupled to a first terminal of resistor 715 and a first terminal of resistor 716. A second terminal of resistor 715 is coupled to a VREF input of pulse width modulator 717, which may, for example, be a Texas Instruments UC3525A regulating pulse width modulator. A second terminal of resistor 716 is coupled to an NI INPUT terminal of pulse width modulator 717. An emitter of phototransistor 710 of optocoupler 708 is coupled to a first terminal of capacitor 718, to a first terminal of resistor 719, and to a ground terminal of pulse width modulator 717. A second terminal of capacitor 718 is coupled to a CT terminal and a DISCHARGE terminal of pulse width modulator 717. A second terminal of resistor 719 is coupled to an RT terminal of pulse width modulator 717. A COMP terminal of pulse width modulator 717 is coupled to an INV INPUT terminal of pulse width modulator 717. An OUTB terminal of pulse width modulator 717 is coupled to a first terminal of capacitor 720. A second terminal of capacitor 720 is coupled to a first terminal of pulse width modulator output transformer winding 701. An OUTA terminal of pulse width modulator 717 is coupled to a second terminal of pulse width modulator output transformer winding 701.

Figure 8:
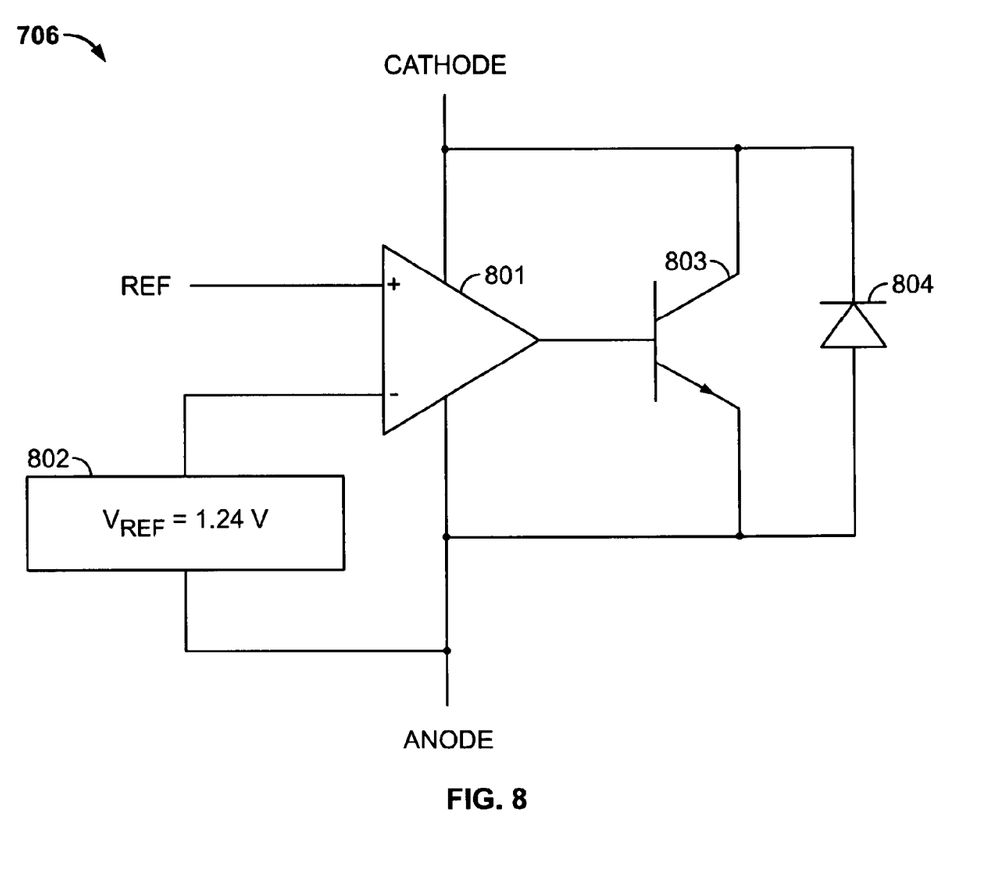
FIG. 8 is a schematic diagram illustrating an example of a regulator for a power supply control circuit for power conversion for a class D amplifier in accordance with at least one embodiment.

FIG. 8 is a schematic diagram illustrating an example of a regulator 706 for a power supply control circuit for power conversion for a class D amplifier in accordance with at least one embodiment. A regulator control input of regulator 706 is coupled to a noninverting input of comparator 801. A positive terminal of regulator 706 is coupled to a positive supply terminal of comparator 801, to a collector of NPN transistor 803, and to a cathode of diode 804. A negative terminal of regulator 706 is coupled to a negative supply terminal of comparator 801, to a negative terminal of voltage reference 802, to an emitter of NPN transistor 803, and to an anode of diode 804. A positive terminal of voltage reference 802 is coupled to an inverting input of comparator 801. An output of comparator 801 is coupled to a base of NPN transistor 803. In accordance with at least one embodiment, regulator 706 may be implemented using discrete components or using an integrated device, such as, for example, Texas Instruments TLV431B low voltage adjustable precision shunt regulator.

Figure 9A:
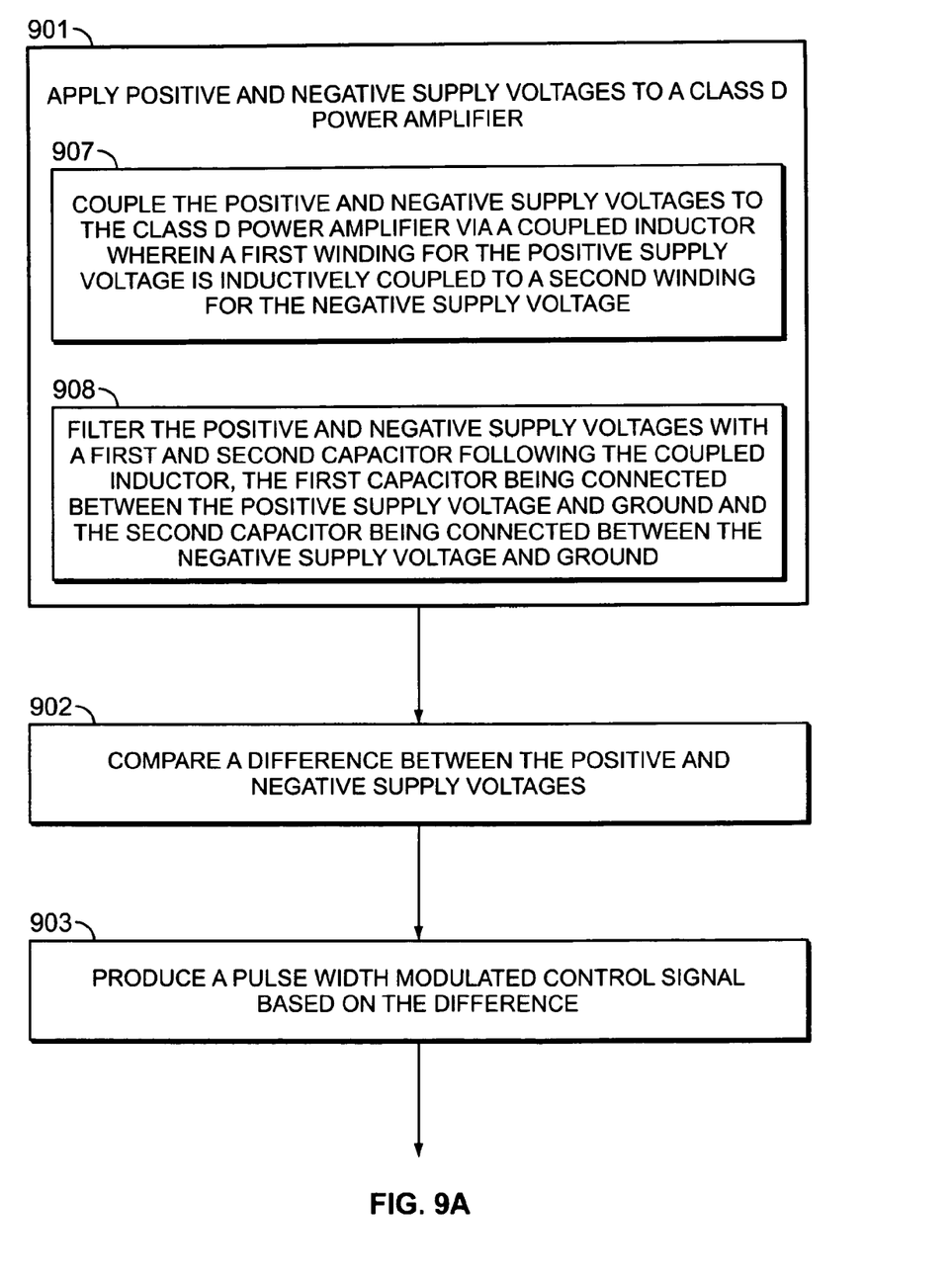
FIGS. 9A and 9B are a flow chart illustrating a method for power conversion for a class D amplifier in accordance with at least one embodiment.
Figure 9B:
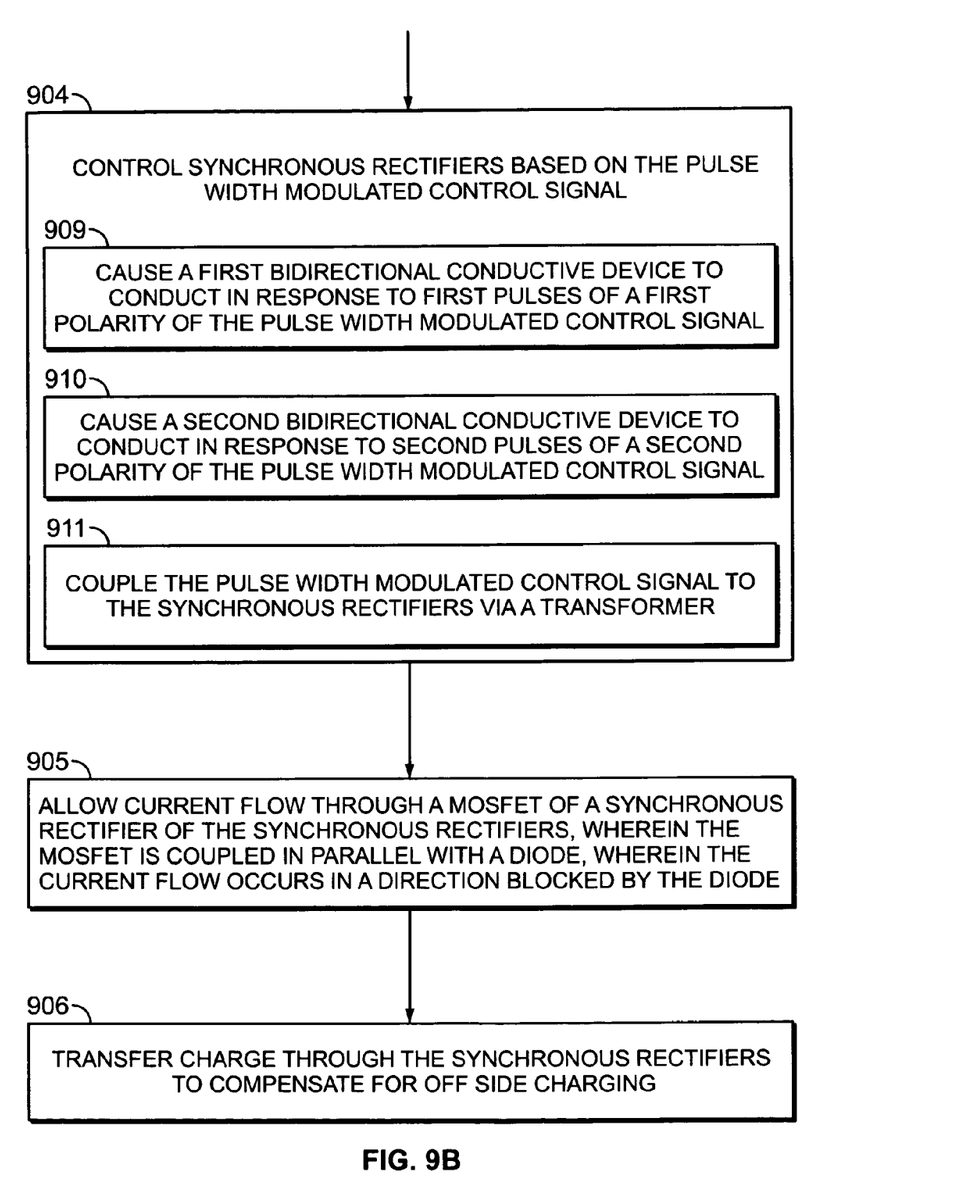

FIGS. 9A and 9B are a flow chart illustrating a method for power conversion for a class D amplifier in accordance with at least one embodiment. The method begins in step 901, where positive and negative supply voltages are applied to a class D power amplifier. Step 901 may comprise steps 907 and/or 908. In step 907, the positive and negative supply voltages are coupled to the class D power amplifier via a coupled inductor. The first winding for the positive supply voltage is inductively coupled to a second winding for the negative supply voltage. In step 908, the positive and negative supply voltages are filtered with a first and second capacitor following the coupled inductor. The first capacitor is connected between the positive supply voltage and ground. The second capacitor is connected between the negative supply voltage and ground.

From step 901, the method continues to step 902. In step 902, a difference between the positive and negative supply voltages is compared. From step 902, the method continues in step 903. In step 903, a pulse width modulated control signal is produced based on the difference. From step 903, the method continues at step 904. In step 904, synchronous rectifiers are controlled based on the pulse width modulated control signal. Step 904 may comprise steps 909, 910, and/or 911. In step 909, a first bidirectional conductive device is caused to conduct in response to first pulses of a first polarity of the pulse width modulated control signal. In step 910, a second bidirectional conductive device is caused to conduct in response to second pulses of a second polarity of the pulse width modulated control signal. In step 911, the pulse width modulated control signal is coupled to the synchronous rectifiers via a transformer.

From step 904, the method continues to step 905. In step 905, current flow is allowed through a MOSFET of a synchronous rectifier of the synchronous rectifiers. The MOSFET is coupled in parallel with a diode. The current flow occurs in a direction blocked by the diode. From step 905, the method continues to step 906. In step 906, charge is transferred through the synchronous rectifiers to compensate for off side charging.

While the control system in accordance with at least one embodiment may be implemented using analog electronic devices, the control system may, in accordance with at least one embodiment, include digital control circuitry. For example, the control system may be implemented using a microcontroller to perform some or all of the method steps described above. Any functionality not performed by digital control circuitry may be implemented using analog electronic devices.

Thus, a method and apparatus for a power conversion for a class D amplifier is described. Although the present invention has been described with respect to certain specific embodiments, it will be clear to those skilled in the art that the inventive features of the present invention are applicable to other embodiments as well, all of which are intended to fall within the scope of the present invention.

What is claimed is:

1. A method comprising:
   applying positive and negative supply voltages to a class D power amplifier;
   comparing a difference between the positive and negative supply voltages;
   producing a modulated control signal based on the difference;
   controlling synchronous rectifiers based on the modulated control signal.

2. Apparatus comprising:
   a power supply circuit comprising synchronous rectifiers,
   a class D amplifier coupled to the power supply circuit; and
   a power supply control circuit coupled to the power supply circuit, the power supply control circuit providing a modulated control signal to control the power supply circuit based on a difference between positive and negative supply voltages provided by the power supply circuit.

3. Apparatus comprising:
   a regulator comprising a comparator and a voltage reference, the comparator coupled to a positive supply voltage and a negative supply voltage of a class D power amplifier for comparing a comparison voltage obtained from a difference between the positive supply voltage and the negative supply voltage to a reference voltage of the voltage reference; and
   a modulator, the modulator coupled to the regulator for producing a modulated control signal to control the positive supply voltage and the negative supply voltage by controlling synchronous rectifiers of a power supply circuit, the power supply circuit providing the positive supply voltage and the negative supply voltage.

* * * * *